(12) United States Patent
Kojima (10) Patent No.: US 9,190,381 B2
(45) Date of Patent: Nov. 17, 2015

(54) CONNECTION METHOD, CONNECTION STRUCTURE, INSULATING ADHESIVE MEMBER, ELECTRONIC COMPONENT HAVING ADHESIVE MEMBER, AND METHOD FOR MANUFACTURING SAME

(71) Applicant: DEXERIALS CORPORATION, Tokyo (JP)

(72) Inventor: Ryoji Kojima, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 14/363,067

(22) PCT Filed: Dec. 7, 2012

(86) PCT No.: PCT/JP2012/081749
§ 371 (c)(1),
(2) Date: Jun. 5, 2014

(87) PCT Pub. No.: WO2013/085019
PCT Pub. Date: Jun. 13, 2013

(65) Prior Publication Data
US 2014/0346684 A1 Nov. 27, 2014

(30) Foreign Application Priority Data
Dec. 9, 2011 (JP) .................. 2011-270125

(51) Int. Cl.
*H01L 23/52* (2006.01)
*H01L 23/48* (2006.01)
(Continued)

(52) U.S. Cl.
CPC ............ *H01L 24/30* (2013.01); *H01L 21/6836* (2013.01); *H01L 21/78* (2013.01);
(Continued)

(58) Field of Classification Search
CPC .. H01L 24/30; H01L 24/83; H01L 2224/8385
USPC .......................................... 257/783; 438/118
See application file for complete search history.

(56) References Cited

U.S. PATENT DOCUMENTS 6,479,757 B1 * 11/2002 Tsukagoshi et al. .......... 174/259

FOREIGN PATENT DOCUMENTS

JP     A-61-50344     3/1986
JP     A-2001-23726     1/2001
(Continued)

OTHER PUBLICATIONS

International Search Report issued in International Patent Application No. PCT/JP2012/081749 dated Mar. 19, 2013 (with translation).

*Primary Examiner* — Luan C Thai
(74) *Attorney, Agent, or Firm* — Oliff PLC (57) ABSTRACT

An insulating adhesive film is formed by laminating a first insulating adhesive layer which contains a filler in an insulating adhesive composition and a second insulating adhesive layer which contains no filler in an insulating adhesive composition. $H/2 < Tf < H \leq Tf+Tn$ is satisfied, wherein H is the height of the bump of the IC chip, Tf is the thickness of the first insulating adhesive layer, and the Tn is the thickness of the second insulating adhesive layer. The side of the substrate on which an electrode is formed and the side of an IC chip on which a bump is formed are connected via the insulating adhesion film arranged such that the first insulating adhesive layer and the electrode-forming side of the electronic component are opposed to thereby connect the electrode of the substrate and the bump of the IC chip.

10 Claims, 6 Drawing Sheets

(51) Int. Cl.
  *H01L 21/50* (2006.01)
  *H01L 21/48* (2006.01)
  *H01L 23/00* (2006.01)
  *H01L 21/78* (2006.01)
  H01L 23/544 (2006.01)
  H01L 21/683 (2006.01)

(52) U.S. Cl.
  CPC ............... H01L 24/29 (2013.01); H01L 24/32 (2013.01); H01L 24/73 (2013.01); H01L 24/81 (2013.01); H01L 24/83 (2013.01); H01L 24/92 (2013.01); H01L 21/6835 (2013.01); H01L 23/544 (2013.01); H01L 24/11 (2013.01); H01L 24/13 (2013.01); H01L 24/16 (2013.01); H01L 24/94 (2013.01); H01L 2221/68327 (2013.01); H01L 2223/54426 (2013.01); H01L 2224/1134 (2013.01); H01L 2224/1146 (2013.01); H01L 2224/131 (2013.01); H01L 2224/13082 (2013.01); H01L 2224/13111 (2013.01); H01L 2224/13144 (2013.01); H01L 2224/13147 (2013.01); H01L 2224/16227 (2013.01); H01L 2224/16238 (2013.01); H01L 2224/2919 (2013.01); H01L 2224/2929 (2013.01); H01L 2224/2939 (2013.01); H01L 2224/29082 (2013.01); H01L 2224/29387 (2013.01); H01L 2224/29393 (2013.01); H01L 2224/3001 (2013.01); H01L 2224/30505 (2013.01); H01L 2224/3201 (2013.01); H01L 2224/32225 (2013.01); H01L 2224/73104 (2013.01); H01L 2224/814 (2013.01); H01L 2224/81191 (2013.01); H01L 2224/81203 (2013.01); H01L 2224/81444 (2013.01); H01L 2224/81903 (2013.01); H01L 2224/8385 (2013.01); H01L 2224/83191 (2013.01); H01L 2224/83203 (2013.01); H01L 2224/83851 (2013.01); H01L 2224/83855 (2013.01); H01L 2224/83862 (2013.01); H01L 2224/83874 (2013.01); H01L 2224/92 (2013.01); H01L 2224/9211 (2013.01); H01L 2224/94 (2013.01); H01L 2924/07802 (2013.01); H01L 2924/15788 (2013.01)

(56) References Cited

FOREIGN PATENT DOCUMENTS

| | | |
|---|---|---|
| JP | A-2003-152022 | 5/2003 |
| JP | A-2005-112916 | 4/2005 |
| JP | B2-4195541 | 12/2008 |
| JP | A-2011-231137 | 11/2011 |

* cited by examiner

ND METHOD FOR MANUFACTURING SAME

CONNECTION METHOD, CONNECTION STRUCTURE, INSULATING ADHESIVE MEMBER, ELECTRONIC COMPONENT HAVING ADHESIVE MEMBER, AND METHOD FOR MANUFACTURING SAME

FIELD OF THE INVENTION

The present invention relates to a method for connecting a substrate and an electronic component via an insulating adhesive member formed by laminating two insulating adhesive layers, a connection structure obtained by this connection method, an insulating adhesive member, and an electronic component having an insulating adhesive member, and a method for manufacturing the same.

The present application asserts priority rights based on JP Patent Application 2011-270125 filed in Japan on Dec. 9, 2011. The total contents of disclosure of the Patent Application of the senior filing date are to be incorporated by reference into the present Application.

BACKGROUND OF THE INVENTION

Conventionally, in semiconductor implementation, a flip chip method is carried out, wherein a side of an IC (Integrated Circuit) on which electrodes (bumps) are formed and the side of a substrate on which electrodes (electrode pads) are formed are opposed to each other to electrically connect the bumps of the IC chip and the electrode pads of the substrate.

In this flip chip method, in order to externally protect the connection between the electrodes and to relax the stress attributable to the difference in the linear expansion coefficients of the IC chip and the substrate, a liquid thermosetting adhesive called an underfill agent is poured between the semiconductor chip and the substrate and allowed to be cured, usually after the electrodes are connected.

In recent years, miniaturization of IC chips has been rapidly advanced. With this advancement, pitches between adjoining electrodes and gaps between semiconductor chips and substrates tend to be increasingly narrower. Thus, if an underfill agent is poured in between an IC chip and a substrate by using the capillarity phenomenon, problems are caused, such as occurrence of a void or a long time required for pouring an underfill agent.

Thus, the so-called pre-placement method has been attempted, wherein a liquid adhesive, such as NCPs (Non Conductive Pastes) and non-underfill agents, or a film adhesive, such as NCFs (Non Conductive Films) is applied or adhered on a substrate in advance, and a resin is then cured with thermocompression from a thermocompression bonder to thereby connect the bumps of an IC chip and the electrode pads of a substrate.

Also, a method for applying an NCP on a wafer before cutting into IC chips and half-curing the NCP, and the so-called pre-adhesion method, wherein an NCF is adhered, the thickness of the wafer is then thinned by back-grinding, and the wafer is individualized into pieces by dicing to provide IC chips having an NCF, one of which is implemented on an organic substrate and the like with a flip chip bonder, have been carried out.

For example, Patent Document 1 discloses a pre-adhesion method using ACFs (Anisotropic Conductive Films). Also, Patent Document 2 discloses a method for pre-laminating an NCF on a wafer. Also, Patent Document 3 discloses that the thickness of an NCF is set to the height of a bump±30 µm.

PRIOR-ART DOCUMENTS

Patent Document

PTL 1: Japanese Patent Application Laid-Open No. 61-50344
PTL 2: Japanese Patent Application Laid-Open No. 2001-23726
PTL 3: Japanese Patent No. 4195541

SUMMARY OF THE INVENTION

Inorganic filler particles, such as silica and alumina are usually added to resins constituting adhesives, such as underfill agents, NCPs, and NCFs, in order to decrease the linear expansion coefficient. In the case where a filler is not added to a resin in an adhesive, or in the case where the amount of the filler added is small, problems are caused, such as moisture-absorption reflow after semiconductor implementation, increases in conduction resistance in reliability tests, such as pressure cooker test and temperature cycling test, and delamination of the resin from IC chips and substrates. Thus, 30% by weight or more of a filler is usually added based on the weight of the resin composition in an adhesive.

Unfortunately, in the aforementioned pre-placement and pre-adhesion methods, since a filler-containing resin is interposed between the bumps of the IC chip and the electrode pads of the substrate, the filler are trapped between the bumps and the electrode pads during crimp connection. Accordingly, it is not possible to connect the bumps and the electrode pads in a good condition, and thus, the conduction reliability is severely reduced in the connection structure of the IC chip and the substrate.

Particularly, in recent years, in the case where IC chips are laminated three-dimensionally with a through silicon via (TSV) and the like, the height of solder on bumps has been drastically lower than conventional solder. Accordingly, the influence of trapping of fillers is increasingly more noticeable than before.

The present invention has been suggested in the view of such conventional situations, and is intended to provide a connection method which can prevent trapping of a filler between an electrode of an electronic component and an electrode of a substrate in the case that the electronic component and the substrate are connected by an insulating adhesive member which contains a filler to thereby exert excellent conduction reliability, a connection structure formed by this connection method, an insulating adhesive member, and an electronic component having an insulating adhesive member and a method for manufacturing the same.

To achieve the aforementioned object, the connection method of the present invention, wherein the side of a substrate on which an electrode is formed and the side of an electronic component on which an electrode is formed are connected via an insulating adhesive member, is characterized in that the insulating adhesive member is formed by laminating a first insulating adhesive layer which contains a filler in an insulating adhesive composition and a second insulating adhesive layer which contains no filler in an insulating adhesive composition, in that, $H/2 < Tf < H \le Tf+Tn$ is satisfied, wherein H is the height of the electrode of the electronic component, Tf is the thickness of the first insulating adhesive layer, and Tn is the thickness of the second insulating adhesive layer, and in that the side of the substrate on which an electrode is formed and the side of the electronic component on which an electrode is formed are connected via the insulating adhesive member arranged such that the first insulating adhesive layer and the side of the electronic component on which an electrode is formed are opposed to thereby connect the electrode of the substrate and the electrode of the electronic component.

Alternatively, to achieve the aforementioned object, the electronic component having an insulating adhesive member of the present invention, wherein the electronic component having an insulating adhesive member is formed by adhering an insulating adhesive member on the side of the electronic component on which an electrode is formed, is characterized in that the insulating adhesive member is formed by laminating a first insulating adhesive layer which contains a filler in an insulating adhesive composition and a second insulating adhesive layer which contains no filler in an insulating adhesive composition, in that the first insulating adhesive layer is adhered on the side of the electronic component on which an electrode is formed so as to be opposed to the electrode of the electronic component, and in that $H/2<Tf<H\leq Tf+Tn$ is satisfied, wherein H is the height of the electrode of the electronic component, Tf is the thickness of the first insulating adhesive layer, and Tn is the thickness of the second insulating adhesive layer.

Alternatively, to achieve the aforementioned object, the method for manufacturing an electronic component having an insulating adhesive member of the present invention, wherein the electronic component having an insulating adhesive member is formed by adhering an insulating adhesive member on the side of the electronic component on which an electrode is formed, is characterized in that the insulating adhesive member is formed by laminating a first insulating adhesive layer which contains a filler in an insulating adhesive composition and a second insulating adhesive layer which contains no filler in an insulating adhesive composition, in that $H/2<Tf<H\leq Tf+Tn$ is satisfied, wherein H is the height of the electrode of the electronic component, Tf is the thickness of the first insulating adhesive layer, and Tn is the thickness of the second insulating adhesive layer, and in that the first insulating adhesive layer is adhered on the side of the electronic component on which an electrode is formed so as to be opposed to the electrode of the electronic component.

Alternatively, to achieve the aforementioned object, the insulating adhesive member of the present invention, wherein the insulating adhesive member is for connecting the side of a substrate on which an electrode is formed and the side of an electronic component on which an electrode is formed, is characterized in that the insulating adhesive member is formed by laminating a first insulating adhesive layer which contains a filler in an insulating adhesive composition and is to be adhered on the side of the electronic component on which an electrode is formed so as to be opposed to the electrode of the electronic component and a second insulating adhesive layer which contains no filler in an insulating adhesive composition, and in that $H/2<Tf<H\leq Tf+Tn$ is satisfied, wherein H is the height of the electrode of the electronic component, Tf is the thickness of the first insulating adhesive layer, and Tn is the thickness of the second insulating adhesive layer.

Alternatively, to achieve the aforementioned object, the connection structure of the present invention, wherein the connection structure is formed by being connected with a connection method for connecting the side of a substrate on which an electrode is formed and the side of an electronic component on which an electrode is formed via an insulating adhesive member, is characterized in that the insulating adhesive member is formed by laminating a first insulating adhesive layer which contains a filler in an insulating adhesive composition and a second insulating adhesive layer which contains no filler in an insulating adhesive composition, in that $H/2<Tf<H\leq Tf+Tn$ is satisfied, wherein H is the height of the electrode of the electronic component, Tf is the thickness of the first insulating adhesive layer, and Tn is the thickness of the second insulating adhesive layer, and in that the side of the substrate on which an electrode is formed and the side of the electronic component on which an electrode is formed are connected via the insulating adhesive member arranged such that the first insulating adhesive layer and the side of the electronic component on which an electrode is formed are opposed to thereby connect the electrode of the substrate and the electrode of the electronic component.

Effects of Invention

According to the present invention, in a two-layer structured insulating adhesive member, the thickness of the first and the second insulating adhesive layers satisfies $H/2<Tf<H\leq Tf+Tn$, wherein H is the height of an electrode of an electronic component, Tf is the thickness of a first insulating adhesive layer which contains a filler, and Tn is the thickness of a second insulating adhesive layer. The electronic component and the substrate are then connected via an insulating adhesive member arranged such that the first insulating adhesive layer is opposed to the electrode of the electronic component.

In this way, the thickness of the first insulating adhesive layer opposed to the side of the electronic component on which an electrode is formed and the entire thickness of the insulating adhesive film are controlled in the relationship with the height of the electrode of the electronic component. Accordingly, the filler is not trapped between the electrode of the electronic component and the electrode of the substrate. Then, since the insulating adhesive composition which contains no filler and constitutes the second insulating adhesive layer is easily eliminated between these electrodes, the electrodes are completely connected to each other. This enables the connection structure to exert excellent conduction reliability.

DETAILED DESCRIPTION OF THE INVENTION

Embodiments of the present invention (referred to as "the present embodiment", hereinbelow) will be described hereinbelow by referring to the drawings in the following order.
1. Summary of the connection method
2. IC chip having a film
3. Method for manufacturing an IC chip having a film
4. Method for connecting the IC chip and a printed wiring substrate
5. Examples

1. Summary of the Connection Method

The connection method in accordance with the present embodiment connects the side of a substrate on which an electrode is formed and the side of an electronic component on which an electrode is formed via an insulating adhesive member. In this insulating adhesive member, a first insulating adhesive layer which contains a filler and a second insulating adhesive layer which contains no filler are laminated, and a release backing is provided on the second insulating adhesive layer.

If H is the height of an electrode of the electronic component, Tf is the thickness of the first insulating adhesive layer, and Tn is the thickness of the second insulating adhesive layer here, $H/2 < Tf < H \leq Tf + Tn$ (Expression 1) is satisfied.

The insulating adhesive member is adhered on the electrode-forming side of the electronic component such that the electrode-forming side of the electronic component and the first insulating adhesive layer are opposed. Then, the electronic component on which the insulating adhesive member is adhered (the electronic component having the adhesive member) is connected to an electrode-forming side of the substrate with thermocompression.

In this way, the thickness of the first insulating adhesive layer opposed to the electrode-forming side of the electronic component and the entire thickness of the insulating adhesive member are controlled as (Expression 1) in the relationship with the height of the electrode of the electronic component. That is, the tip of the electrode of the electronic component is within the second insulating adhesive layer which contains no filler. Accordingly, when the electronic component having an adhesive member is connected to the substrate with thermocompression, the filler is not trapped between the electrode of the electronic component and the electrode of the substrate. The electrodes are then completely connected to each other because the insulating adhesive composition which contains no filler constituting the second insulating adhesive layer is easily eliminated between these electrodes. This enables the connection structure to exert excellent conduction reliability.

2. IC Chip Having a Film

An IC chip having a film will be described hereinbelow, wherein the IC chip having a film is formed by adhering an insulating adhesion film, which is one example of the insulating adhesive member, on an IC chip, which is one example of the electronic component.

Figure 1:
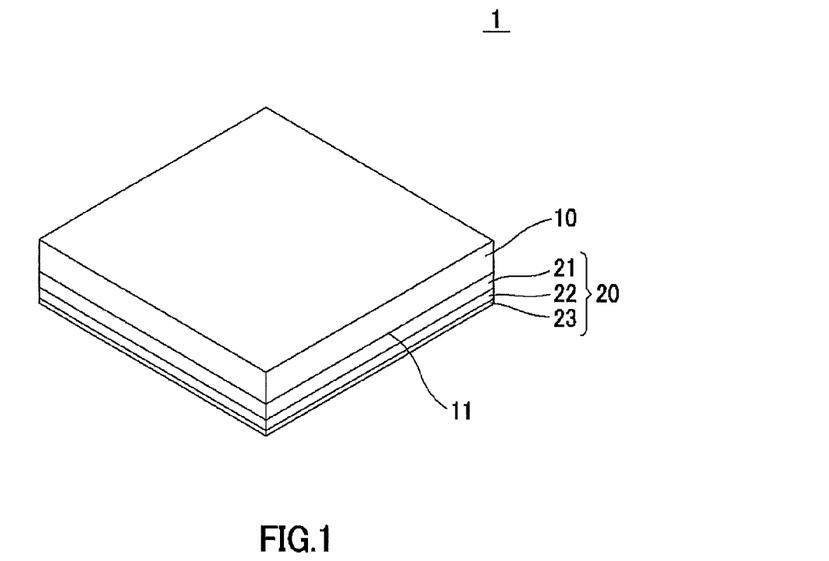
FIG. 1 is a perspective view showing the appearance of one example of an IC chip having a film.
Figure 2:
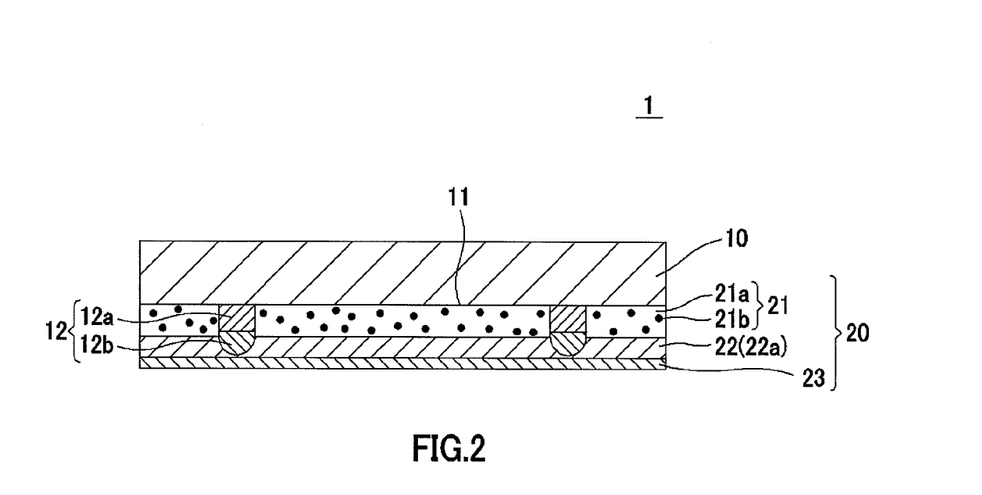
FIG. 2 is a cross sectional view of the IC chip having a film.

FIG. 1 is a perspective view showing the appearance of an IC chip having a film 1 formed by adhering an insulating adhesion film 20 on an IC chip 10. Alternatively, FIG. 2 is a cross sectional view of the IC chip having a film 1. On one side of the IC chip 10 (for example, the functional side), bumps 12 are formed. Then, on the side of the IC chip 10 on which the bumps 12 are formed (the bump-forming side 11), an insulating adhesion film 20 is adhered. In the insulating adhesion film 20, an first insulating adhesive layer 21 which contains a filler 21b and an second insulating adhesive layer 22 which contains no filler are laminated, and a release backing 23 is provided on the second insulating adhesive layer 22. The insulating adhesion film 20 is adhered on the bump-forming side 11 of the IC chip 10 such that the bump-forming side 11 and the first insulating adhesive layer 21 are opposed.

In the insulating adhesion film 20, the first insulating adhesive layer 21 is composed by which contains a filler 21b in an insulating adhesive composition 21a. The second insulating adhesive layer 22 is composed solely of an insulating adhesive composition 22a which contains no filler.

The bump 12 is composed of a copper (Cu) pillar 12a and a hemispherical solder cap 12b which is provided on the tip of the copper pillar 12a. It should be noted that the configuration of the bump 12 may include, but is not limited to, bumps solely composed of a copper pillar (copper pillar bumps), Au-plated bumps, Au-stud bumps, and solder bumps.

Although the height of the bump 12 of from 5 μm to 100 μm is usable, the height of the bump is preferably from 5 μm to 70 μm, and more preferably from 30 μm to 70 μm.

In the chip having a film 1, if H is the height of the bump 12, Tf is the thickness of the first insulating adhesive layer 21, and Tn is the thickness of the second insulating adhesive layer 22, $H/2 < Tf < H \leq Tf + Tn$ (Expression 1) is satisfied.

Figure 3:
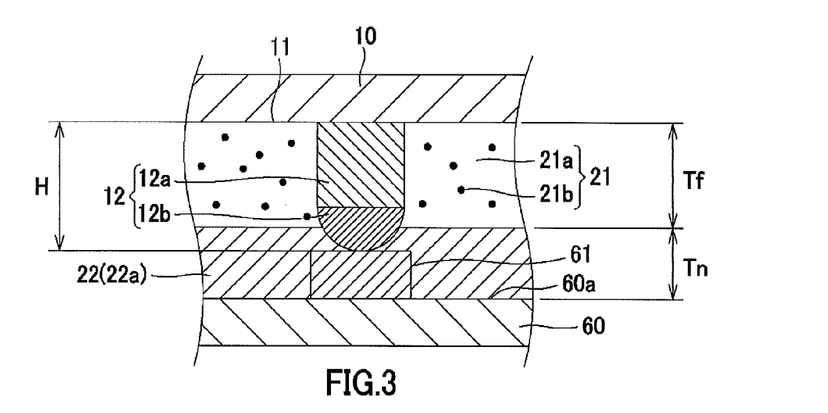
FIG. 3 is a partial cross sectional view partially showing a condition in which the IC chip having a film is arranged on the electrode-forming side of a printed wiring substrate.

FIG. 3 is a partial cross sectional view partially showing a condition in which the IC chip having a film 1 is arranged on the side of a printed wiring substrate 60, which is one example of the substrate, on which an electrode pad 61 is formed (the electrode-forming side 60a.) The printed wiring substrate 60 is composed of a glass-epoxy resin laminate on which copper foil is stuck.

The thickness of the first insulating adhesive layer 21 which contains the filler 21b, Tf is set to satisfy $H/2 < Tf$ in the relationship with the thickness of the bump 12, H. Accordingly, since the filler 21b is present in a sufficient amount, effects from the filler 21b, such as a decrease in the linear expansion coefficient and stabilization of the thermal conductivity, can be achieved to thereby promote enhancement of connection reliability.

Alternatively, the thickness of the first insulating adhesive layer 21, Tf and the thickness of the insulating adhesion film 20, Tf+Tn are set so as to satisfy $Tf < H \leq Tf + Tn$ in the relationship with the thickness of the bump, H. That is, the main body of the bump 12 including the copper (Cu) pillar 12a is arranged within the first insulating adhesive layer 21 which contains the filler 21b. In addition to this, the tip of the solder cap 12b to be connected to the electrode pad 61 of the printed wiring substrate 60 is arranged within the second insulating adhesive layer 22 which contains no filler.

Accordingly, the insulating adhesive composition 22a which contains no filler and constitutes the second insulating adhesive layer 22 between the bump 12 and the electrode pad 61 is easily eliminated by thermocompression. Within the second insulating adhesive layer 22 like this, the tip of the bump 12 is arranged, and in that condition, the bump 12 and the electrode pads 61 are opposed. Accordingly the filler is not trapped between the bump 12 and the electrode pad 61, even if the IC chip having a film 1 is connected to the printed wiring substrate 60. Accordingly, since the bump 12 and the electrode pad 61 is completely connected, excellent conduction reliability can be exerted in the connection structure of the IC chip 10 and the printed wiring substrate 60.

Also, since the thickness of the insulating adhesion film 20 is set to larger than the height of the bump 12, a sufficient amount of the insulating adhesive compositions 21a and 22a of the insulating adhesive film 20 can be charged when the IC chip having a film 1 is connected to the printed wiring substrate 60. Accordingly, in a resulting connection structure, the insulating adhesive compositions 21a and 22a of the insulating adhesion film 20 are brought into intimate contact with the electrode forming side 60a of the printed wiring substrate 60 to thereby prevent a void from occurring. As the result, the mechanical connection reliability will be satisfactory.

If Tf≤H/2 in (Expression 1), the effects from the filler 21b are not sufficiently exerted, and the mechanical connection reliability will be decreased in the resulting connection structure.

Figure 4:
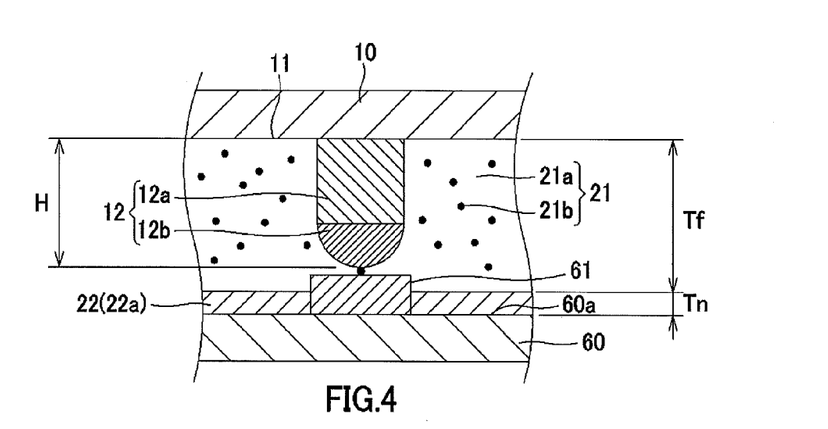
FIG. 4 is a partial cross sectional view partially showing a condition in which the IC chip having a film is arranged on the electrode-forming side of a printed wiring substrate as a tentative configuration.

Alternatively, if H≤Tf in (Expression 1), the filler 21b is trapped between the bump 12 and the electrode pad 61 when the IC chip having a film 1 is connected to the printed wiring substrate 60, and it is not possible to connect the bump 12 and the electrode pad 61 in a satisfactory condition. Accordingly, in the connection structure of the IC chip 10 and the printed wiring substrate 60, the conduction resistance value is increased, and the conduction reliability is decreased (see FIG. 4.)

Figure 5:
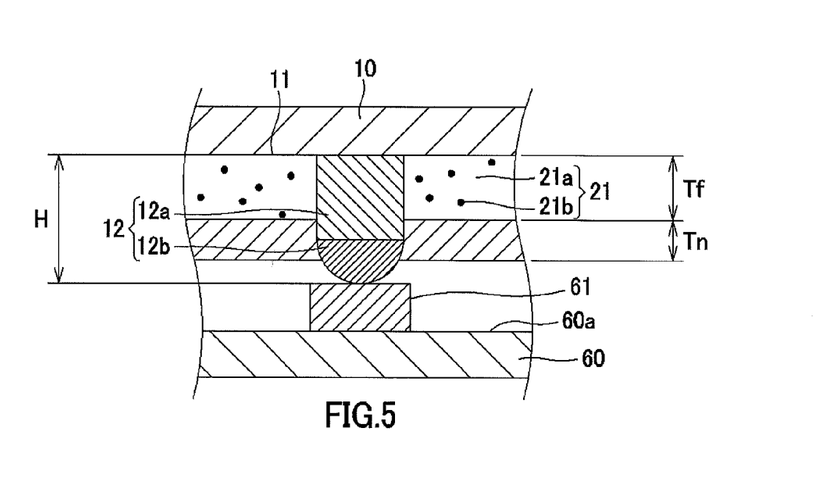
FIG. 5 is a partial cross sectional view partially showing a condition in which the IC chip having a film is arranged on the electrode-forming side of a printed wiring substrate as a tentative configuration.

Alternatively, if Tf+Tn<H in (Expression 1), the amount of the adhesive resin charged becomes insufficient when the IC chip having a film 1 is connected to the printed wiring substrate 60, and a void occurs between the second adhesive layer 22 and the electrode-forming side 60a of the printed wiring substrate 60. As the result, in the connection structure of the IC chip 10 and the printed wiring substrate 60, the mechanical conduction reliability is decreased (see FIG. 5.)

In this way, it is possible to promote enhancement of the mechanical connection reliability via the filler 21b by satisfying the relationship of H/2<Tf<H≤Tf+Tn (Expression 1). Also, it is possible to prevent the filler 21b from being trapped between the bump 12 and the electrode on the printed wiring substrate 60 to thereby achieve the conduction reliability.

Examples of the inorganic filler include, in addition to carbon and silicon dioxide, metal oxide particulates, such as alumina, silica, magnesia, or ferrite, for example, silicates, such as talc, mica, kaolin, and zeolite, and particulates, such as barium sulfate, calcium carbonate, or fullerenes. Examples of the inorganic filler also include glass microbeads, carbon fibers, chalk, for example, quartz, asbestos, feldspar, and mica.

Examples of the organic filler include, for example, epoxy resins, melamine resins, urea resins, acrylic resins, phenol resins, polyimide resins, polyamide resins, polyester resins, or Teflon (registered trademark) resins. Of these, carbon and silicon dioxide are preferred.

It should be noted that materials constituting a filler may be used alone or two or more kinds in combination.

Either of the insulating adhesive composition 21a of the first insulating adhesive layer 21 and the insulating adhesive composition 22a of the second insulating adhesive layer 22 is a normal binder (adhesive) which contains film-forming resins, thermosetting resins, latent curing agents, and silane coupling agents.

The film-forming resins have preferably an average molecular weight approximately from 10000 to 80000. Examples of the film-forming resin include various resins, such as epoxy resins, modified epoxy resins, urethane resins, and phenoxy resins. Of these, from a viewpoint of a film forming condition, connection reliability, and the like, phenoxy resins are particularly preferred.

Examples of the thermosetting resin include, but are not particularly limited to, as long as the resin has fluidity at normal temperature, commercial available epoxy resins, and acrylic resins.

Examples of the epoxy resin include, but are not particularly limited to, naphthalene epoxy resins, biphenyl epoxy resins, phenol novlac epoxy resins, bisphenol epoxy resins, stilbene epoxy resins, triphenol methane epoxy resins, phenol aralkyl epoxy resins, naphthol epoxy resins, dicyclopentadiene epoxy resins, and triphenylmethane epoxy resins. These may be used alone or two or more kinds in combination.

The acrylic resins are not particularly limited, and acrylic compounds and liquid acrylates can be selected as appropriate depending on the purpose. Examples of the acrylic resin include, for example, methyl acrylate, ethyl acrylate, isopropyl acrylate, isobutyl acrylate, epoxy acrylate, ethylene glycol diacrylate, diethylene glycol diacrylate, trimethylolpropane triacrylate, dimethylol tricyclodecane diacrylate, tetramethylene glycol tetraacrylate, 2-hydroxy-1,3-diacryloxypropane, 2,2-bis[4-(acryloxymethoxy)phenyl]propane, 2,2-bis[4-(acryloxyethoxy)phenyl]propane, dicyclopentenyl acrylate, tricyclodecanyl acrylate, tris(acryloxyethyl)isocyanurate, urethane acrylate, and epoxy acrylate. It should be noted that those having methacrylate instead of acrylate can be used. These may be used alone or two or more kinds in combination.

Examples of the latent curing agent include, but are not particularly limited to, for example, various curing agents, such as thermosetting and UV setting curing agents. Although the latent curing agents are not usually reacted, they are activated by various triggers selected depending on applications, such as heat, light, and pressure to thereby start reaction. Examples of the method for activating a thermally-active latent curing agent include a method for forming active species (cations and anions) by thermal dissociation reaction and the like, a method in which a curing agent is stably dispersed in an epoxy resin near room temperature and is compatibilized with and dissolved in an epoxy resin at high temperature to thereby start curing reaction, a method for starting curing reaction by dissolving a curing agent encapsulated with molecular sieves, and a dissolution and curing method by using microcapsules. Examples of the thermally-active latent curing agent include imidazole-, hydrazide-curing agents, boron trifluoride-amine complexes, sulfonium salts, amineimide, polyamine salts, dicyaneamide, and modification thereof. These may be used alone or two or more kinds in combination.

Of these, a microcapsule imidazole-based latent curing agent is suitable.

Examples of the silane coupling agent include, but are not particularly limited to, epoxy-, amino-, mercapto-sulfide-, and ureido-coupling agents. Addition of a silane coupling agent increases the adhesive quality at the interface between an organic material and an inorganic material.

The release backing 23 is formed by applying a releasing agent such as silicone on, for example, PET (Poly Ethylene Terephthalate), OPP (Oriented Polypropylene), PMP (Poly-4-methlpentene-1), and PTFE (Polytetrafluoroethylene), and the shape of the first insulating adhesive layer 21 and the second insulating adhesive layer 22 can be retained.

3. Method for Manufacturing an IC Chip Having a Film

Figure 6:
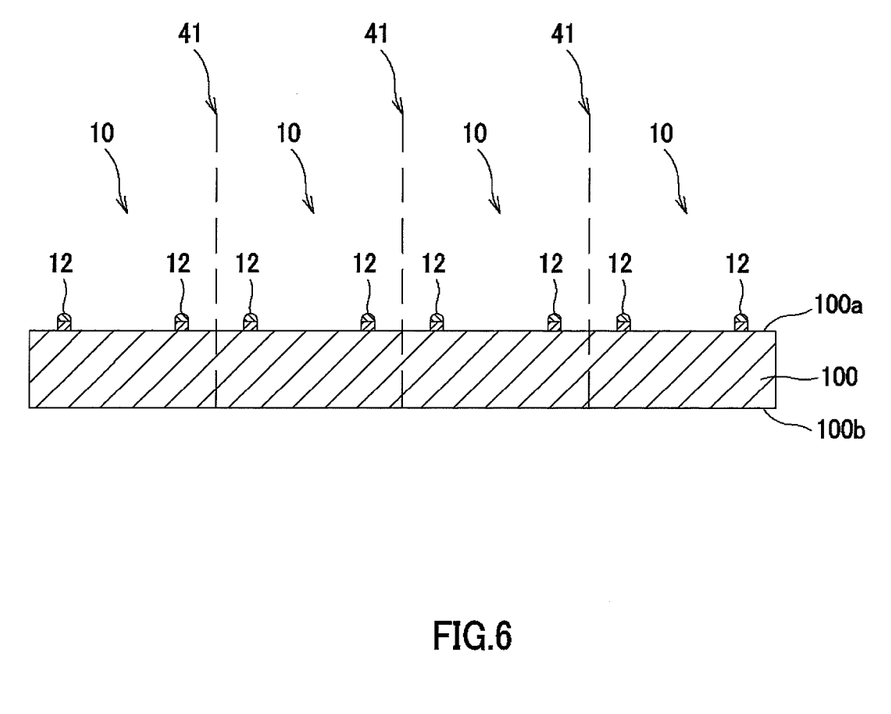
FIG. 6 is a cross sectional view schematically showing an example of a wafer for manufacturing IC chips.
Figure 7:
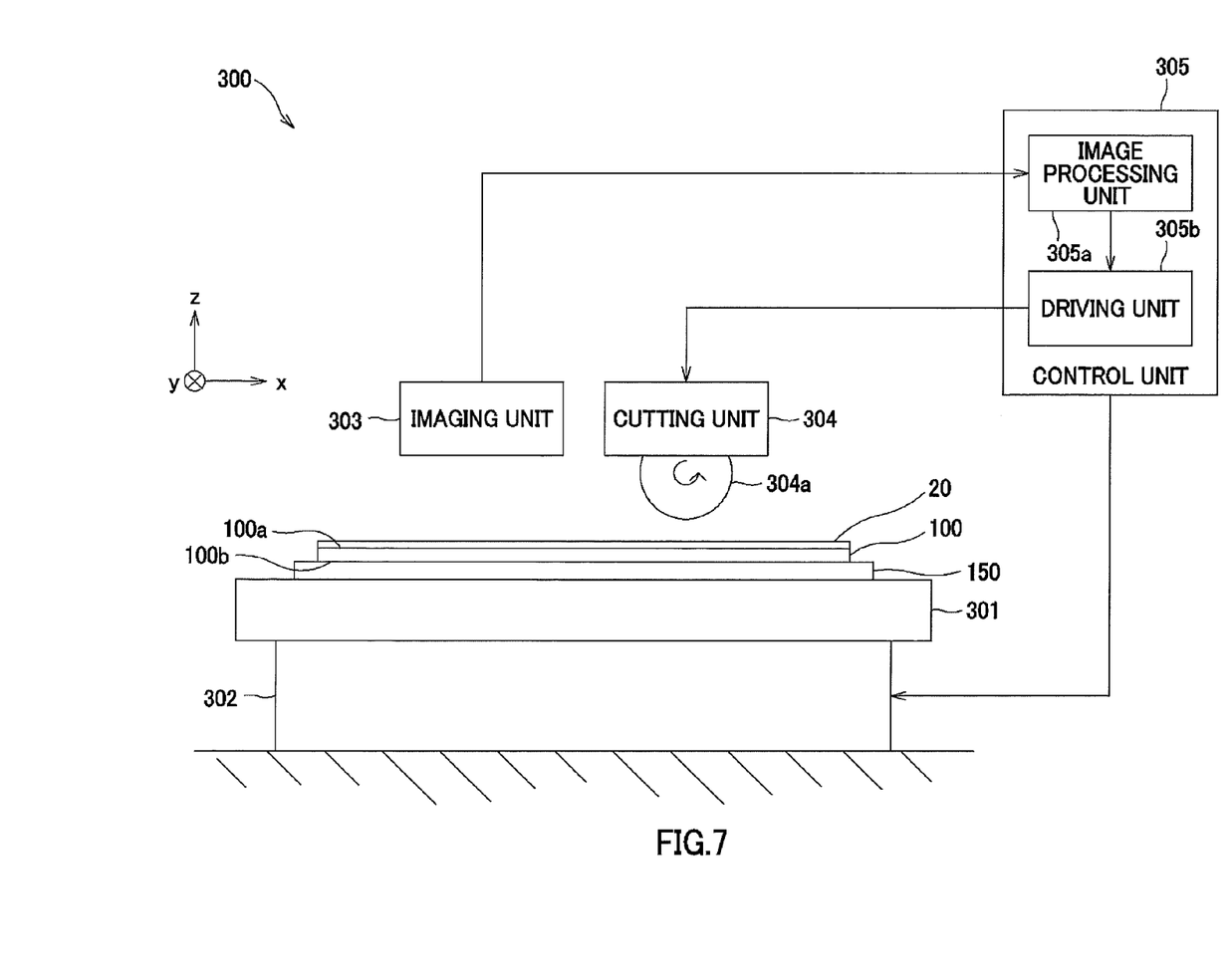
FIG. 7 is a view showing dicing apparatus, which is one example of a splitting apparatus.

Subsequently, one example of the method for manufacturing an IC chip having a film 1 will be described. FIG. 6 is a cross sectional view schematically showing an example of a wafer for manufacturing IC chips. A wafer 100 is a semiconductor wafer such as a silicon wafer. On one surface of the wafer 100, bumps 12 are formed. Alternatively, FIG. 7 is a view showing a schematic configuration of a dicing apparatus 300, which is one example of a splitting apparatus.

In the present embodiment, an insulating adhesion film 20 is adhered on the bump-forming side 100a of a wafer 100 with a roll laminator (not shown) such that a first insulating adhesive layer 21 is opposed to the bump-forming side 100a of the wafer 100 (laminating process).

After the adhering process, the side opposite to the bump-forming side 100a of the wafer 100 (backside 100b) is ground with a back-grinding apparatus (not shown) (back grinding process). This process reduces the thickness of the wafer 100, and additionally, allows the backside 100b of the wafer 100 to be a smooth surface.

The backside 100b of the wafer 100 on which the insulating adhesion film 20 is then adhered is stuck on a dicing tape 150 (sticking process). Splitting this wafer 100 along scribe lines 41 with a dicing apparatus 300 allows the wafer 100 to be individualized into a plurality of IC chips 10.

The dicing apparatus 300 is equipped with a table 301, an alignment stage 302, an imaging unit 303, a cutting unit 304, and a control unit 305. The wafer 100, on which the insulating adhesion film 20 is adhered and is in the condition of adhesion on the dicing tape 150, is mount on the table 301 of the dicing apparatus 300. The table 301 can fix the dicing tape 150 which retains the wafer 100 on the table 301 by means of, for example, suction from a decompression apparatus (not shown).

The alignment stage 302 moves the table 301 in the x and y directions based on the control of the control unit 305.

The imaging unit 303 receives the light reflected on the surface 100a of the wafer 100 and transmitted through the insulating adhesion film 20 to thereby capture an image of the surface 100a of the wafer 100. The imaging unit 303 has, for example, a lighting member for lighting the wafer 100, an optical system for receiving the light reflected on the surface 100a of the wafer 100, and an imaging device for images captured by the optical system. The imaging unit 303 transmits the information of the images captured to the control unit 305. The configuration of the imaging unit 303 can capture, for example, visible light images, without particular limitation.

The cutting unit 304 can cut the wafer 100 based on the control by the control unit 305. The cutting unit 304 has a blade 304a to cut the wafer 100. The cutting unit 304 presses the rotating blade 304a on the wafer 100 to thereby cut the wafer 100.

The control unit 305 has an image processing unit 305a and a driving unit 305b. The image processing unit 305a receives the image information of the surface of the wafer 100 from the imaging unit 303. The image processing unit 305a decides the position of a scribe lines 41 based on the image information received. The image processing unit 305a determines to split the wafer 100 at the position of the scribe line 41. The image processing unit 305a transmits the information on the position to split the wafer 100 to the driving unit 305b.

The driving unit 305b receives information on the position to split the wafer 100 from the image processing unit 305a. The driving unit 305b drives the alignment stage 302 and the cutting unit 304 based on the information on the positions to split the wafer 100. This allows the driving unit 305b to split the wafer 100 on which the insulating adhesion film 20 is adhered to be individualized into the IC chips having a film 1.

For example, in the case where the image processing unit 305a decides to split the wafer 100 along a scribe line 41 in the x direction, the driving unit 305b drives the alignment phase 302 to move the table 301 so as to position one end of the scribe line 41 below the blade 304a.

The driving unit 305b then drives the cutting unit 304, moves the cutting unit 304 downward with the blade 304a rotating, and brings the blade 304a into contact with the wafer 100. Subsequently, the driving unit 305b drives the alignment stage 302 to thereby move the wafer 100 in the x direction. Accordingly, cutting processing with the cutting unit 304 the along the scribe lines 41 enables the wafer 100 to be split in the x direction.

Figure 8:
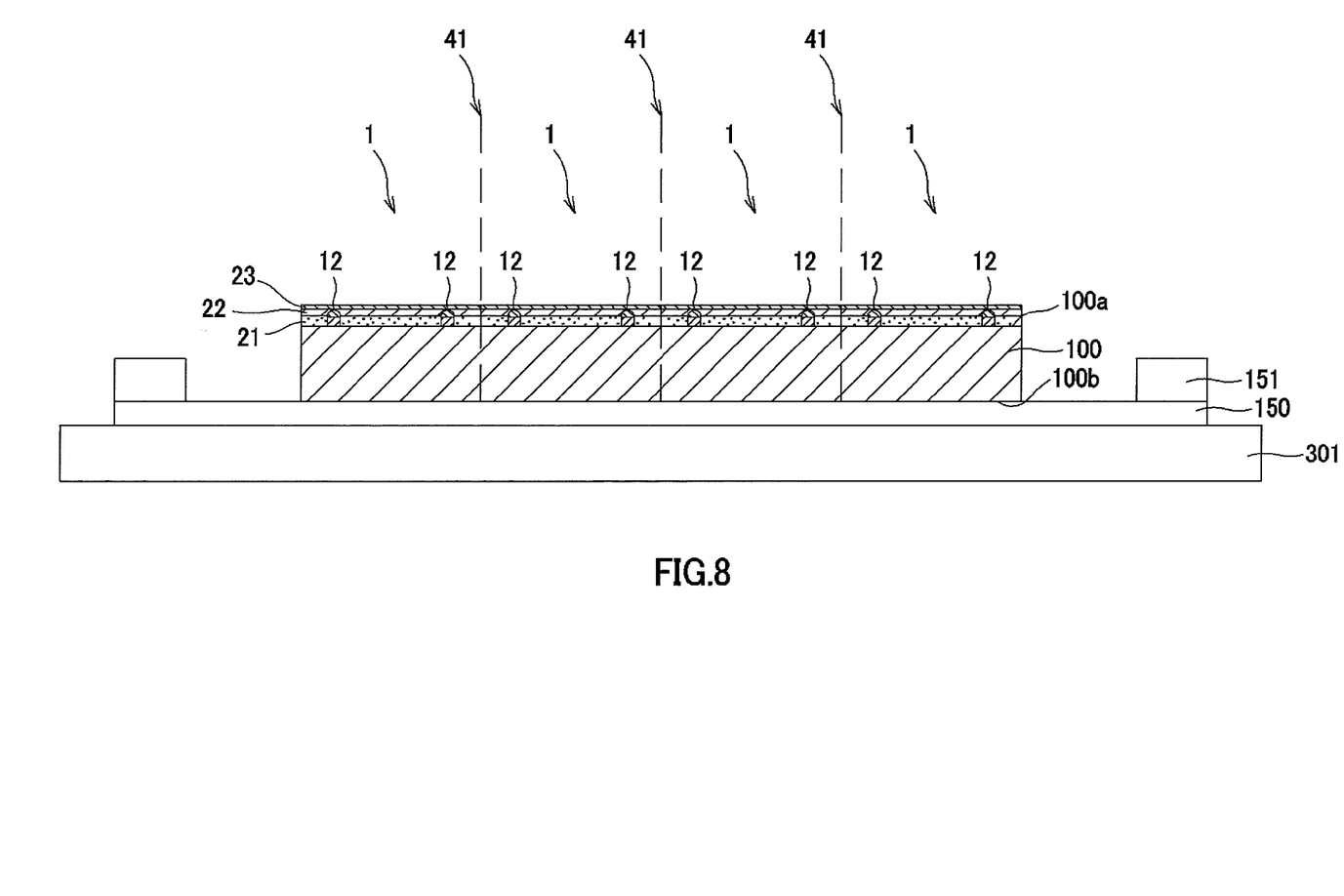
FIG. 8 is a schematic cross sectional view in a phase of capturing an image of the surface of a wafer.

FIG. 8 is a schematic cross section in a phase of capturing an image of a surface 100a of the wafer 100. In the present embodiment, first, the imaging unit 303 of the dicing apparatus 300 receives the light reflected on the surface 100a of the wafer 100 and transmitted through the release backing 23, the second insulating adhesive layer 22, and the first insulating adhesive layer 21 to thereby capture an image of the surface 100a of the wafer 100.

In the case that the insulating adhesion film 20 has a transmittance of 74% or more against the light of 440 nm or more and 700 nm or less, an inexpensive apparatus to capture images in the visible light region can be used as the imaging unit 303. Also, with the insulating adhesion film 20 adhered on the surface 100a of the wafer 100, images of the scribe lines 41, the bumps 12, the circuit pattern, alignment marks, and the like can be captured. This allows the wafer 100 to be split in a condition that the insulating adhesion film 20 remains adhered on the surface 100a of the wafer 100.

The image processing unit 305a of the dicing apparatus 300 then receives the information of the images captured with the imaging unit 303. The image processing unit 305a determines the position to split the wafer 100 based on the image information captured. The image processing unit 305a recognizes the position of the scribe line 41 from the image of the wafer 100 and determines to split the wafer 100 along the scribe line 41. The image processing unit 305a recognizes the positions of the bumps 12 or the alignment marks from the image of the wafer 100 to thereby recognize the position of the scribe line 41.

When the image processing unit 305a determines the position to split the wafer 100, the driving unit 305b drives the alignment stage 302 and the cutting unit 304 based on the determination to thereby split the wafer 100 to be individualized into IC chips having a film 1. The dicing apparatus 300 splits the wafer 100, under the condition that the circumference of the dicing tape 150 has been fixed to the backside of the wafer 100 with a frame 151, to thereby individualize the wafer 100 as IC chips having a film 1.

In this way, the method for producing the IC chip having a film 1 can produce the IC chip having a film 1 with such dicing processing.

4. Method for Connecting the IC Chip and a Printed Wiring Substrate

Figure 9:
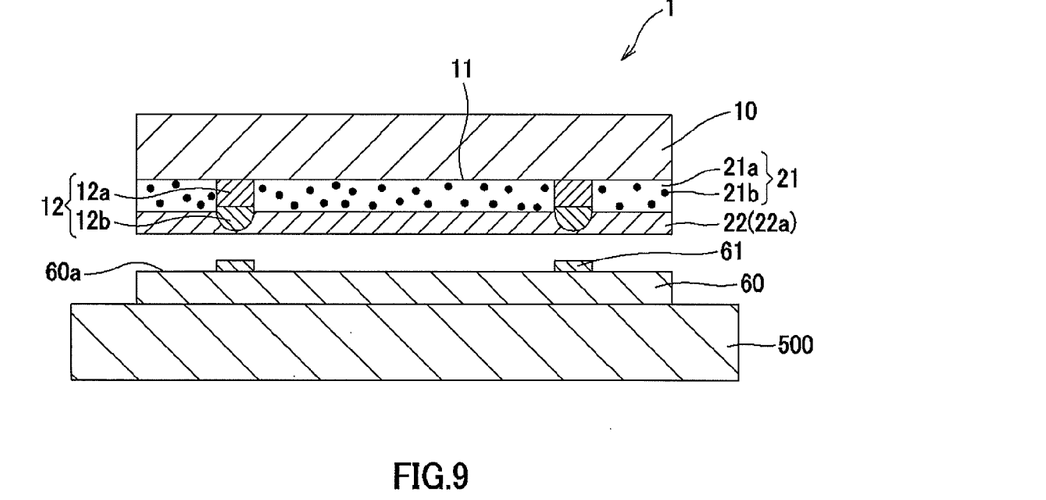
FIG. 9 is a view for illustrating a connection method in accordance with the present embodiment.
Figure 10:
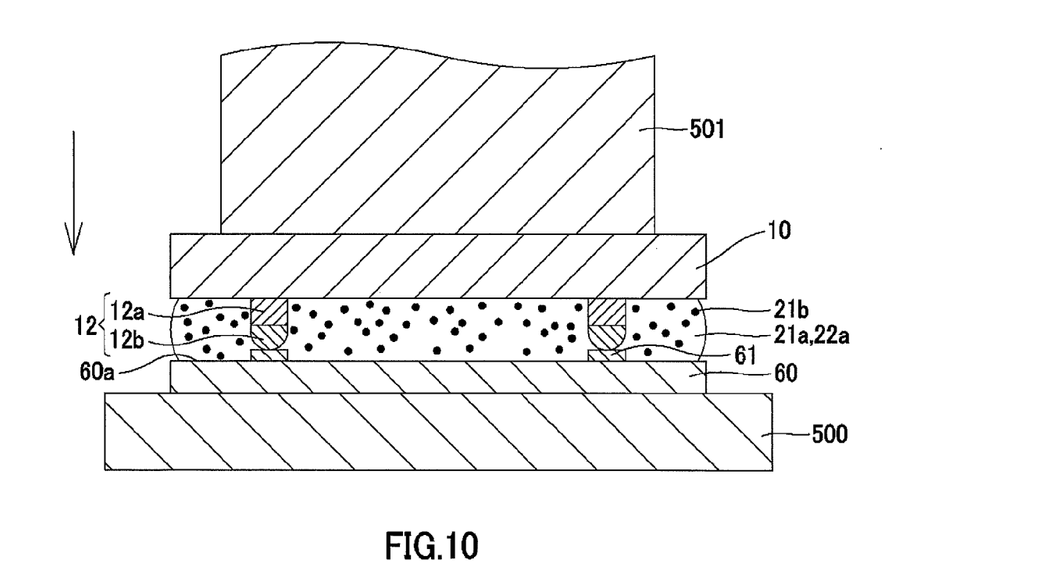
FIG. 10 is a view for illustrating a connection method in accordance with the present embodiment.

FIGS. 9 and 10 are for illustrating the connection method in the present embodiment. In the present embodiment, an IC chip having a film 1 obtained with dicing processing is connected to a printed wiring substrate 60 with thermocompression.

Specifically, first, a release backing 23 is released from the IC chip having a film 1. Then, as shown in FIG. 9, electrode pads 61 of the printed wiring substrate 60 mounted on a table 500 and bumps 12 of an IC chip 10 are opposed. That is, a second insulating adhesive layer 22 and the side of the printed wiring substrate 60 on which electrode pads 61 are formed (electrode-forming side 60a) are opposed. In this condition, the IC chip having a film 1 after the release backing 23 is released is arranged on the electrode forming side 60a of the printed wiring substrate 60 (arranging process).

Then, as shown in FIG. 10, a thermocompression head 501 is lowered in the direction of the arrow on the upper side of the IC chip 10. While pressure is applied at, for example, approximately from 30 N/m² to 70 N/m², heating is carried out at a temperature higher than the curing temperature of the thermosetting resin of the insulating adhesion film 20, for example, approximately from a temperature 180 to 270° C. and from 15 to 25 seconds, depending on types of thermosetting resins. This thermocompression allows insulating adhesive compositions 21a and 22a to be molten to thereby allow the bumps 12 and the electrode pads 61 are connected. In this condition, the insulating adhesive compositions 21a and 22a are cured. Accordingly, a connection structure formed by connecting the IC chip 10 and the printed wiring substrate 60 can be provided (connecting process).

In this connecting process, the insulating adhesive composition 22a which contains no filler and constitutes the second insulating adhesive layer 22 between the bumps 12 and the electrode pads 61 is easily eliminated by thermocompression. Within the second insulating adhesive layer 22 like this, the bumps 12 and the electrode pads 61 are opposed. Even if the insulating adhesive compositions 21a and 22a of the insulating adhesion film 20 are molten by thermocompression to thereby allow the bumps 12 and the electrode pads 61 to be connected, the filler will not be trapped between the bumps 12 and the electrode pads 61. This allows the bump 12 and the electrode pads 61 to be completely connected. As the result, in the connection structure of the IC chip 10 and the printed wiring substrate 60, excellent conduction reliability can be exerted.

It should be noted that the substrate in the present embodiment is not particularly limited as long as it is a substrate on which an electrode is provided, and may be, for example, a glass substrate, a plastic substrate, and a printed wiring substrate composed of a glass-epoxy resin laminate on which copper foil is adhered, or any other substrate.

Alternatively, the electronic component in the present embodiment may be other electronic component instead of the IC chip 10. Example of the component include semiconductor chips other than IC chips, such as LSI (Large Scale Integration) chips, semiconductor devices, such as chip capacitors, printed wiring substrates, and semiconductor implementation materials for driving liquid crystals, COFs (Chips On Film).

Alternatively, the electrodes of electronic components are not limited to the bumps 12. Alternatively, the electrodes of substrates are not limited to the electrode pads 61. Any of the electrodes may be any terminal electrodes, wiring electrodes, and the like, as long as they can be electrically connected to each other.

Alternatively, the insulating adhesive members are not limited to the insulating adhesion films (NCFs) as aforementioned. The insulating adhesive member may be a two-layered insulating adhesive paste (NCP) obtained by applying, for example, each of an insulating adhesive composition paste which contains a filler and an insulating adhesive composition paste which contains no filler to each thickness, Tf and Tn so as to satisfy (Expression 1) in the relationship of the thickness of the bump, H and drying the pastes.

EXAMPLES

5. Examples

Specific examples of the present invention will be subsequently described.

Example 1

A first insulating adhesive layer having a thickness (Tf) of 25 μm prepared by dispersing 50 parts by mass of a filler, which is a silica filler having a particle size of 2 μm (trade name: SO-E6, manufactured by Admatechs Company Limited) in 50 parts by mass of a phenoxy resin (trade name: YP-50, manufactured by Nippon Steel Chemical Co., Ltd.), 25 parts by mass of a bisphenol A epoxy resin (trade name: EP-828, manufactured by Mitsubishi Chemical Corporation), and 25 parts by mass of a solid epoxy resin (trade name: HP-7200H, manufactured by DIC Corporation) was produced on a first release backing.

Additionally, a second insulating adhesive layer having a thickness (Tn) of 8 μm comprising 50 parts by mass of the phenoxy resin, 25 parts by mass of the bisphenol A epoxy resin, and 25 parts by mass of the solid epoxy resin (any trade names and manufacturers are same as those in the first insulating adhesive) as well and containing no filler was produced on a second release backing. The first and second insulating adhesive layers were then adhered on each other to make a two-layered insulating adhesion film.

The insulating adhesion film in the condition that the first release backing was released was adhered via laminating processing with a roll laminator such that the first insulating adhesive layer adhered to the wafer. The wafer was then thinned with a back-grinding apparatus. Subsequently, the wafer on which this insulating adhesion film was adhered was transferred on a dicing tape and individualized by blade dicing. The IC chip having a film thus obtained was connected to a printed wiring substrate by use of a flip chip bonder under thermocompression conditions of 250° C., 50 N/m², and 20 seconds. The connection structure obtained was individualized by dicing to provide test pieces of Example 1.

The IC chip here is an IC chip (6.3 mm×6.3 mm×0.2 mm in thickness) equipped with bumps having a height (H) of 30 μm formed by providing a solder cap (Sn 2.5 Ag) having a height of 10 μm on the tip of a copper pillar having a diameter of 33 μm and a height of 20 μm.

Alternatively, the printed wiring substrate is a glass epoxy substrate (trade name: 679F, manufactured by Hitachi Chemical Company, Ltd., 38 mm×38 mm 0.6 mm in thickness) having electrode pads (Au/Ni-plated Cu based) on which a solder surface layer having a thickness of 20 μm is formed.

Example 2

In Example 2, test pieces of the connection structure were produced as in Example 1, except that a solder cap (Sn 2.5 Ag) having a height of 10 μm were provided on the tip of a copper pillar having a height of 30 μm, the height (H) of a bump of the IC chip was set to 40 μm, the thickness of the first insulating adhesive layer (Tf) was set to 30 μm, and the thickness of the second insulating adhesive layer (Tn) was set to 15 μm.

Example 3

In Example 3, test pieces of the connection structure were produced as in Example 1, except that a solder cap (Sn 2.5 Ag)

having a height of 20 μm were provided on the tip of a copper pillar having a height of 50 μm, the height (H) of a bump of the IC chip was set to 70 μm, the thickness of the first insulating adhesive layer (Tf) was set to 50 μm, and the thickness of the second insulating adhesive layer (Tn) was set to 25 μm.

Comparative Example 1

In Comparative Example 1, test pieces of the connection structure were produced as in Example 1, except that the height (H) of a bump of the IC chip was set to 30 μm, the thickness of the first insulating adhesive layer (Tf) was set to 20 μm, and the thickness of the second insulating adhesive layer (Tn) was set to 5 μm.

Comparative Example 2

In Comparative Example 2, test pieces of the connection structure were produced as in Example 1, except that the height (H) of a bump of the IC chip was set to 30 μm, the thickness of the first insulating adhesive layer (Tf) was set to 13 μm, and the thickness of the second insulating adhesive layer (Tn) was set to 20 μm.

Comparative Example 3

In Comparative Example 3, test pieces of the connection structure were produced as in Example 1, except that the height (H) of a bump of the IC chip was set to 30 μm, the thickness of the first insulating adhesive layer (Tf) was set to 35 μm, and the thickness of the second insulating adhesive layer (Tn) was set to 5 μm.

Comparative Example 4

Test pieces of the connection structure were produced as in Example 2, except that the insulating adhesion film was adhered with a roll laminator such that the second insulating adhesive layer containing no filler adhered to the wafer.

Comparative Example 5

Test pieces of the connection structure were produced as in Example 2, except that the insulating adhesion film was composed solely of the first insulating adhesive layer containing a filler and having a thickness (Tf) of 45 μm.

Comparative Example 6

Test pieces of the connection structure were produced as in Example 2, except that the insulating adhesion film was composed solely of the second insulating adhesive layer containing no filler and having a thickness (Tn) of 45 μm.

[Observation of Cross Sections (Initial Phase)]

Cross sections of the test pieces of the connection structures of Examples 1 to 3 and Comparative Examples 1 to 6 were polished, and the condition of the cross sections was observed with a scanning acoustic tomograph (SAT). Whether a void occurred or not and whether the filler was trapped between the bump and the electrode pad or not were evaluated. The result of the evaluation is shown in [Table 1]. It should be noted that test pieces having neither occurrence of a void nor occurrence of trapping of filler between the bump and the electrode pad are shown "Good" in [Table 1].

[Observation of Cross Sections (after Reliability Test (PCT))]

Reliability test was conducted on the connection structure of Examples 1 to 3 and Comparative Examples 1 to 6, wherein, after moisture was absorbed in an environment of 60° C./60% RH for 120 hours, reflow was carried out three times with peak humidity at 265° C., and a temperature cycling from −40° C. to 125° C. was repeated for 1000 cycles. After this reliability test, the structures were observed with a scanning acoustic tomograph (SAT), and whether a void occurred or not was evaluated. The result of the evaluation is shown in [Table 1]. It should be noted that structures having no occurrence of voids are shown as "Good" in [Table 1].

[Conduction Resistance]

Initial conduction resistance was measured in the connection structure of Examples 1 to 3 and Comparative Examples 1 to 6. Additionally, reliability test was conducted, wherein after moisture was absorbed in an environment of 60° C./60% RH for 120 hours, reflow was carried out three times with peak humidity at 265° C., and a temperature cycling from −40° C. to 125° C. was repeated for 1000 cycles. After this reliability test, conduction resistance was measured. Structures having an increased rate of the conduction resistance value after reliability test to the initial conduction resistance value less than 10% were evaluated as good (○), and those having an increased rate of 10% or more were evaluated as bad (X). The result of the evaluation is shown in [Table 1].

TABLE 1

|  | H (μm) | Tf (μm) | Tn (μm) | NFC thickness (μm) | Condition of the cross section Initial phase | Condition of the cross section After reliability test | Conduction resistance | Relationship of thickness |
|---|---|---|---|---|---|---|---|---|
| Example 1 | 30 | 25 | 8 | 33 | Good | Good | ○ | H/2 < Tf < H ≤ Tf + Tn |
| Example 2 | 40 | 30 | 15 | 45 | Good | Good | ○ | H/2 < Tf < H ≤ Tf + Tn |
| Example 3 | 70 | 50 | 25 | 75 | Good | Good | ○ | H/2 < Tf < H ≤ Tf + Tn |
| Comparative Example 1 | 30 | 20 | 5 | 25 | A void is present | A void is present | X | Tf + Tn < H |
| Comparative Example 2 | 30 | 13 | 20 | 33 | Good | A void is present | X | Tf ≤ H/2 |
| Comparative Example 3 | 30 | 35 | 5 | 40 | The filler is trapped | Good | X | H ≤ Tf |
| Comparative Example 4 | 40 | 30 | 15 | 45 | The filler is trapped | Good | X | H/2 < Tf < H ≤ Tf + Tn |
| Comparative Example 5 | 40 | 45 | — | 45 | The filler is trapped | Good | X | — |

TABLE 1-continued

|  | H (μm) | Tf (μm) | Tn (μm) | NFC thickness (μm) | Condition of the cross section | | Conduction resistance | Relationship of thickness |
|---|---|---|---|---|---|---|---|---|
|  |  |  |  |  | Initial phase | After reliability test |  |  |
| Comparative Example 6 | 40 | — | 45 | 45 | Good | Good | X | — |

In Examples 1 to 3, the insulating adhesion film in the IC chip having a film satisfies H/2<Tf<H≤Tf+Tn (Expression 1), wherein H is the height of a bump of the IC chip, Tf is the thickness of the first insulating adhesive layer, and Tn is the thickness of the second insulating adhesive layer. Accordingly, it appears that the filler was not trapped between the bump and the electrode pad, and thus, good results were obtained in the observation of the cross section of the initial phase and after the reliability test and in conduction resistance.

Meanwhile, in Comparative Example 1, since the thickness of the insulating adhesion film (Tf+Tn) is less than the height of the bump (H) (Tf+Tn<H), it appears that a void occurred between the second adhesive layer and the electrode-forming side of the printed wiring substrate, the mechanical connection reliability was decreased and, as the result, conduction resistance value was drastically increased.

Alternatively, in Comparative Example 2, since the half of the height of the bump (H/2) is larger than the thickness of the first insulating adhesive layer containing filler (Tf) (Tf≤H/2), it appears that the small amount of the first insulating adhesive layer filled led to the small amount of the filler contained, and thus, effects from the filler such as suppression of the thermal expansion coefficient could not be provided, and the conduction resistance value was increased.

Alternatively, in Comparative Example 3, since the thickness of the first insulating adhesive layer (Tf) is larger than the height of the bump (H) (H≤Tf), it appears that the filler was trapped between the bump and the electrode pad, the bump and the electrode pad could not be connected in a good condition, and, as the result, the conduction resistance value was increased.

In Comparative Example 4, since the second insulating adhesive layer containing no filler was arranged on the bump-forming side of the IC chip, and the first insulating adhesive layer containing the filler covered the tip of the bump, it appears that the filler was trapped between the bump and the electrode pad and the conduction resistance value was increased.

In Comparative Example 5, since the first insulating adhesive layer containing the filler covered the tip of the bump, it appears that the filler was trapped between the bump and the electrode pads, and conduction resistance value was increased.

In Comparative Example 6, since connection was produced only by the second insulating adhesive layer containing no filler, it appears that effects from the filler such as suppression of the thermal expansion coefficient could not be provided, and the conduction resistance value was increased.

REFERENCE SIGNS LIST

1 . . . IC chip having a film
10 . . . IC chip
12 . . . bump
20 . . . insulating adhesion film
21 . . . first insulating adhesive layer
22 . . . second insulating adhesive layer
23 . . . release backing

The invention claimed is:

1. A connection method for connecting a side of a substrate on which an electrode is formed and a side of an electronic component on which an electrode is formed via an insulating adhesive member,
wherein the insulating adhesive member is formed by laminating a first insulating adhesive layer which contains a filler in an insulating adhesive composition and a second insulating adhesive layer which contains no filler in an insulating adhesive composition,
wherein H/2<Tf<H≤Tf+Tn is satisfied, wherein H is the height of the electrode of the electronic component, Tf is the thickness of the first insulating adhesive layer, and Tn is the second insulating adhesive layer, and
wherein the side of the substrate on which an electrode is formed and the side of the electronic component on which an electrode is formed are connected via the insulating adhesive member arranged such that the first insulating adhesive layer and the side of the electronic component on which an electrode is formed are opposed to thereby connect the electrode of the substrate and the electrode of the electronic component.

2. The connection method according to claim 1, wherein the insulating adhesive member is pre-adhered to the side of the electronic component on which an electrode is formed.

3. The connection method according to claim 1, wherein the electrode of the electronic component has a height of from 5 μm to 70 μm.

4. The connection method according to claim 1, wherein the insulating adhesive composition in the first and second insulating adhesive layers comprises an epoxy resin.

5. The connection method according to claim 1, wherein the electrode of the electronic component is a bump which comprises a copper pillar and a solder cap provided on the tip of the copper pillar.

6. An electronic component having an insulating adhesive member formed by adhering the insulating adhesive member on a side of an electronic component on which an electrode is formed,
wherein the insulating adhesive member is formed by laminating a first insulating adhesive layer which contains a filler in an insulating adhesive composition and a second insulating adhesive layer which contains no filler in an insulating adhesive composition, and the first insulating adhesive layer is adhered on the side of the electronic component on which an electrode is formed so as to be opposed to the electrode of the electronic component,
wherein H/2<Tf<H≤Tf+Tn is satisfied, wherein H is the height of the electrode of the electronic component, Tf is the thickness of the first insulating adhesive layer, and Tn is the second insulating adhesive layer.

7. The electronic component having an insulating adhesive member according to claim 6, wherein a release substrate is provided on a side of the second insulating adhesive layer opposite to a side on which the first insulating adhesive layer is formed.

8. A method for manufacturing an electronic component having an insulating adhesive member formed by adhering an insulating adhesive member on a side of an electronic component on which an electrode is formed,
wherein the insulating adhesive member is formed by laminating a first insulating adhesive layer which contains a filler in an insulating adhesive composition and a second insulating adhesive layer which contains no filler in an insulating adhesive composition,
wherein $H/2 < Tf < H \leq Tf+Tn$ is satisfied, wherein H is the height of the electrode of the electronic component, Tf is the thickness of the first insulating adhesive layer, and Tn is the second insulating adhesive layer,
wherein the insulating adhesive member is adhered on the side of the electronic component on which an electrode is formed such that the first insulating adhesive layer is opposed to the electrode of the electronic component.

9. An insulating adhesive member for connecting a side of a substrate on which an electrode is formed and a side of an electronic component on which an electrode is formed,
wherein the insulating adhesive member is formed by laminating a first insulating adhesive layer which contains a filler in an insulating adhesive composition and is adhered on the side of the electronic component on which an electrode is formed so as to be opposed to the electrode of the electronic component and a second insulating adhesive layer which contains no filler in an insulating adhesive composition, and
wherein $H/2 < Tf < H \leq Tf+Tn$ is satisfied, wherein H is the height of the electrode of the electronic component, Tf is the thickness of the first insulating adhesive layer, and Tn is the second insulating adhesive layer.

10. A connection structure formed by connection via a connection method for connecting a side of a substrate on which an electrode is formed and a side of an electronic component on which an electrode is formed via an insulating adhesive member,
wherein the insulating adhesive member is formed by laminating a first insulating adhesive layer which contains a filler in a insulating adhesive composition and a second insulating adhesive layer which contains no filler in an insulating adhesive composition,
wherein $H/2 < Tf < H \leq Tf+Tn$ is satisfied, wherein H is the height of the electrode of the electronic component, Tf is the thickness of the first insulating adhesive layer, and Tn is the second insulating adhesive layer, and
wherein the side of the substrate on which an electrode is formed and the side of the electronic component on which an electrode is formed are connected via the insulating adhesive member arranged such that the first insulating adhesive layer and the side of the electronic component on which an electrode is formed are opposed to thereby connect the electrode of the substrate and the electrode of the electronic component.

* * * * *